US009978561B2

(12) United States Patent
Henstra et al.

(10) Patent No.: US 9,978,561 B2
(45) Date of Patent: May 22, 2018

(54) POST COLUMN FILTER WITH ENHANCED ENERGY RANGE

(71) Applicant: FEI Company, Hillsboro, OR (US)

(72) Inventors: Alexander Henstra, Utrecht (NL); Peter Christiaan Tiemeijer, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days. days.

(21) Appl. No.: 15/230,667

(22) Filed: Aug. 8, 2016

(65) Prior Publication Data

US 2017/0125210 A1 May 4, 2017

(30) Foreign Application Priority Data

Nov. 2, 2015 (EP) .................................... 15192573

(51) Int. Cl.
*H01J 37/28* (2006.01)
*H01J 37/05* (2006.01)
*H01J 37/14* (2006.01)
*H01J 37/22* (2006.01)
*H01J 37/26* (2006.01)

(52) U.S. Cl.
CPC .............. *H01J 37/28* (2013.01); *H01J 37/05* (2013.01); *H01J 37/14* (2013.01); *H01J 37/22* (2013.01); *H01J 37/263* (2013.01); *H01J 2237/057* (2013.01); *H01J 2237/1534* (2013.01); *H01J 2237/2802* (2013.01)

(58) Field of Classification Search
CPC ......... H01J 2237/057; H01J 2237/1534; H01J 2237/2802; H01J 37/05; H01J 37/14; H01J 37/22; H01J 37/263; H01J 37/28; H01J 37/26

See application file for complete search history.

(56) References Cited

U.S. PATENT DOCUMENTS

| 4,851,670 A * | 7/1989 | Krivanek ................ H01J 37/04 250/305 |
| 5,798,524 A | 8/1998 | Kundmann et al. |

(Continued)

OTHER PUBLICATIONS

Feldman, L.C., et al. "Appendix 5", Fundamentals of surface and thin film analysis, Aug. 11, 1986, p. 323, Elsevier Science Publishing Co., Inc, New York, New York.

(Continued)

*Primary Examiner* — Wyatt Stoffa
(74) *Attorney, Agent, or Firm* — Scheinberg & Associates, PC; Michael O. Scheinberg; John E. Hillert

(57) ABSTRACT

The invention relates to a post-column filter (a PCF) for a (Scanning) Transmission Electron Microscope (a (S)TEM). Traditionally these filters use excitations of the optical elements before the slit plane that are identical in both the EFTEM and the EELS mode. Although this eases the task for the person skilled in the art of developing and tuning a PCF, as it reduces the number of degrees of freedom to a manageable amount. Inventors found ways to determine settings of the optical elements before the slit plane for EELS mode that are different from the EFTEM mode and where the performance of the PCF in EELS mode is improved (especially the relative energy range that can be imaged) without degrading the performance of the PCF in EFTEM mode.

Figure 6:
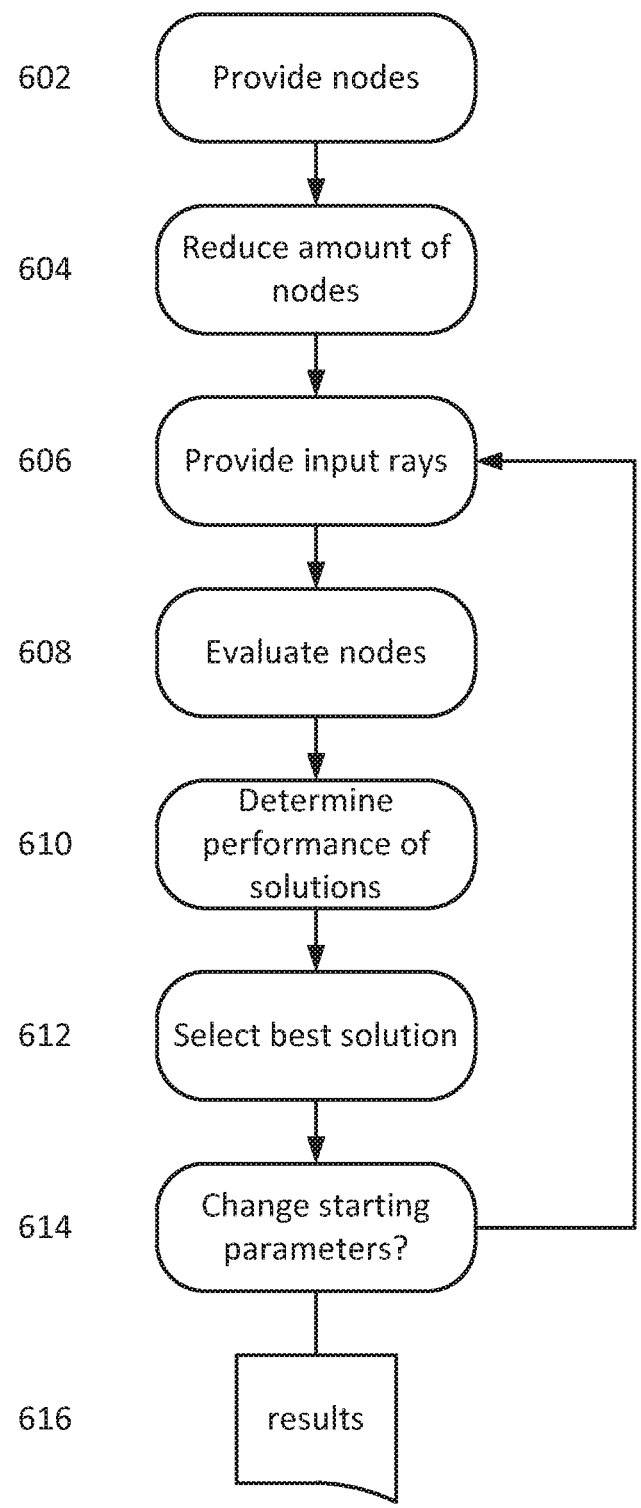

20 Claims, 11 Drawing Sheets ray diagram in EELS mode, no focus in slit plane.

(56) References Cited

U.S. PATENT DOCUMENTS

| | | | |
|---|---|---|---|
| 2009/0194691 A1* | 8/2009 | Kaji | H01J 37/244 |
| | | | 250/311 |
| 2010/0108883 A1* | 5/2010 | Zewail | H01J 37/22 |
| | | | 250/307 |
| 2011/0278451 A1 | 11/2011 | Tiemeijer et al. | |
| 2017/0052264 A1 | 2/2017 | Kingston et al. | |
| 2017/0059493 A1 | 3/2017 | Kingston et al. | |
| 2017/0061610 A1 | 3/2017 | Kingston et al. | |
| 2017/0207058 A1* | 7/2017 | Gubbens | H01J 37/05 |

OTHER PUBLICATIONS

Gubbens, A., et al. "The GIF Quantum, a next generation post-column imaging energy filter", Ultramicroscopy, Jul. 2010, pp. 962-970, vol. 110 Issue 8, 2010 Elsevier B.V.

Krivanek, O., et al, "Parallel detection electron spectrometer using quadrupole lenses," Ultramicroscopy, (1987) pp. 103-116, vol. 22, North Holland, Amsterdam.

Krivanek, O.L., et al. "Design and first applications of a post-column imaging filter", Microsc. Microanal. Microstruct., Jun. 1992, pp. 187-199, vol. 3, No. 2-3, EDP Sciences 1992.

\* cited by examiner

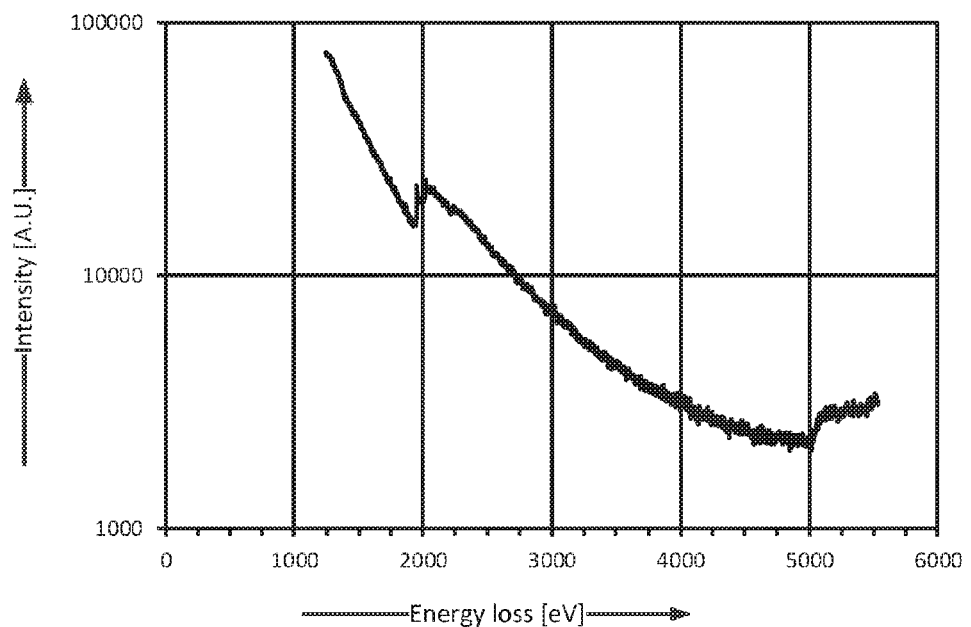
Fig 1: EELS spectrum
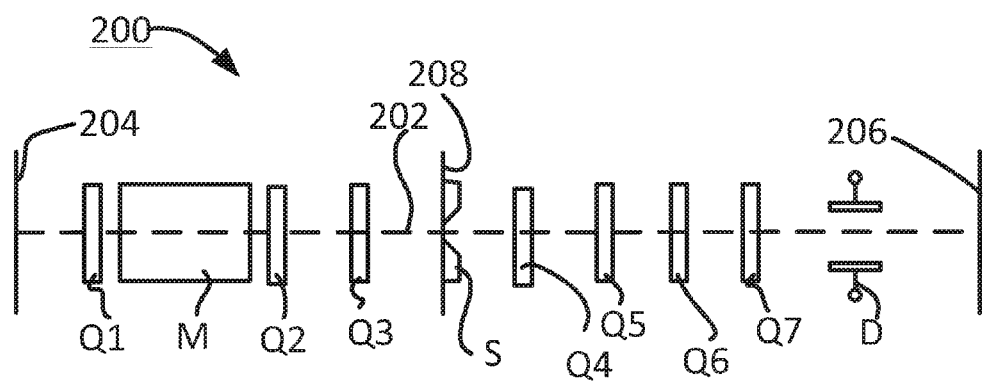
Fig 2: PCF schematic

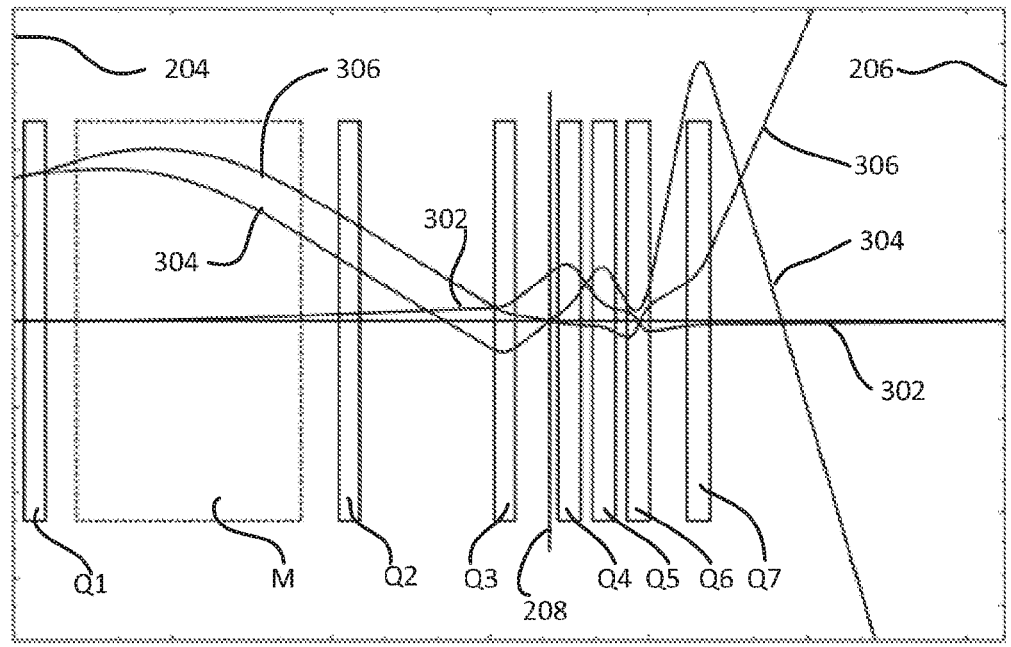
Fig 3: principal ray diagram in EFTEM mode
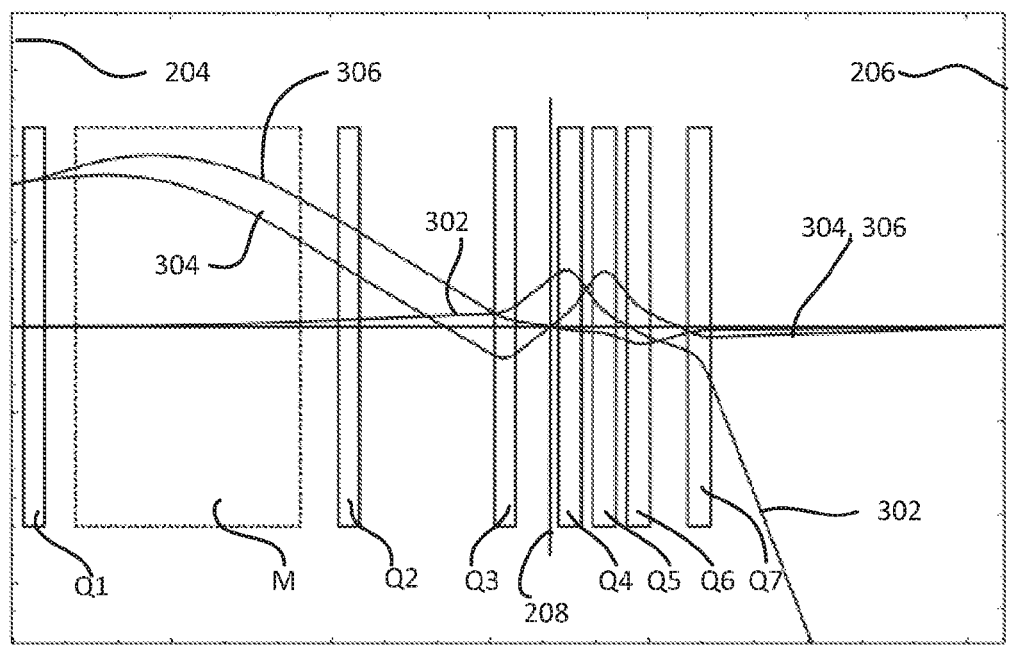
Fig 4a: prior art ray diagram in EELS mode

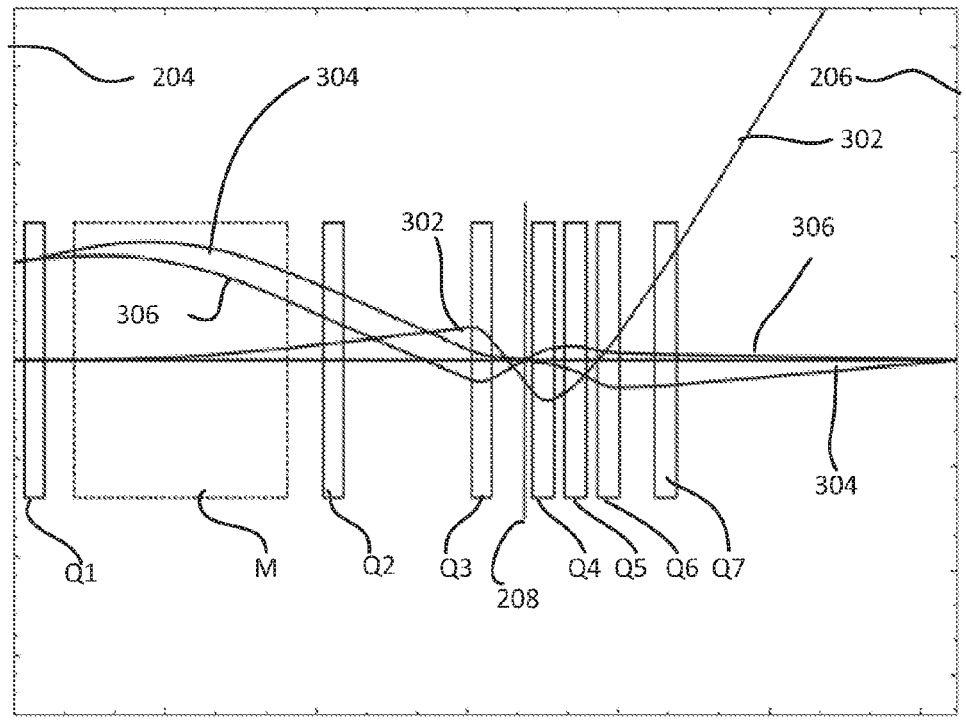
Fig 4b: ray diagram in EELS mode, focus in slit plane
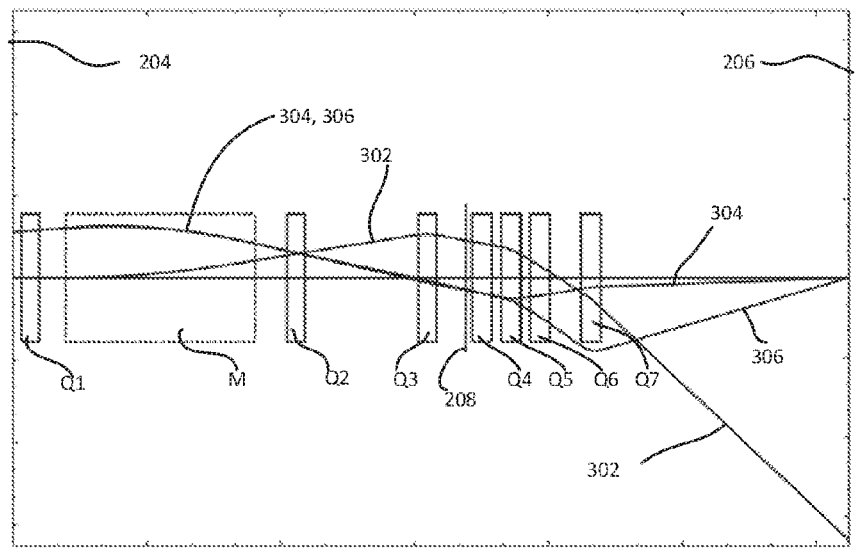
Fig 4c: ray diagram in EELS mode, no focus in slit plane.

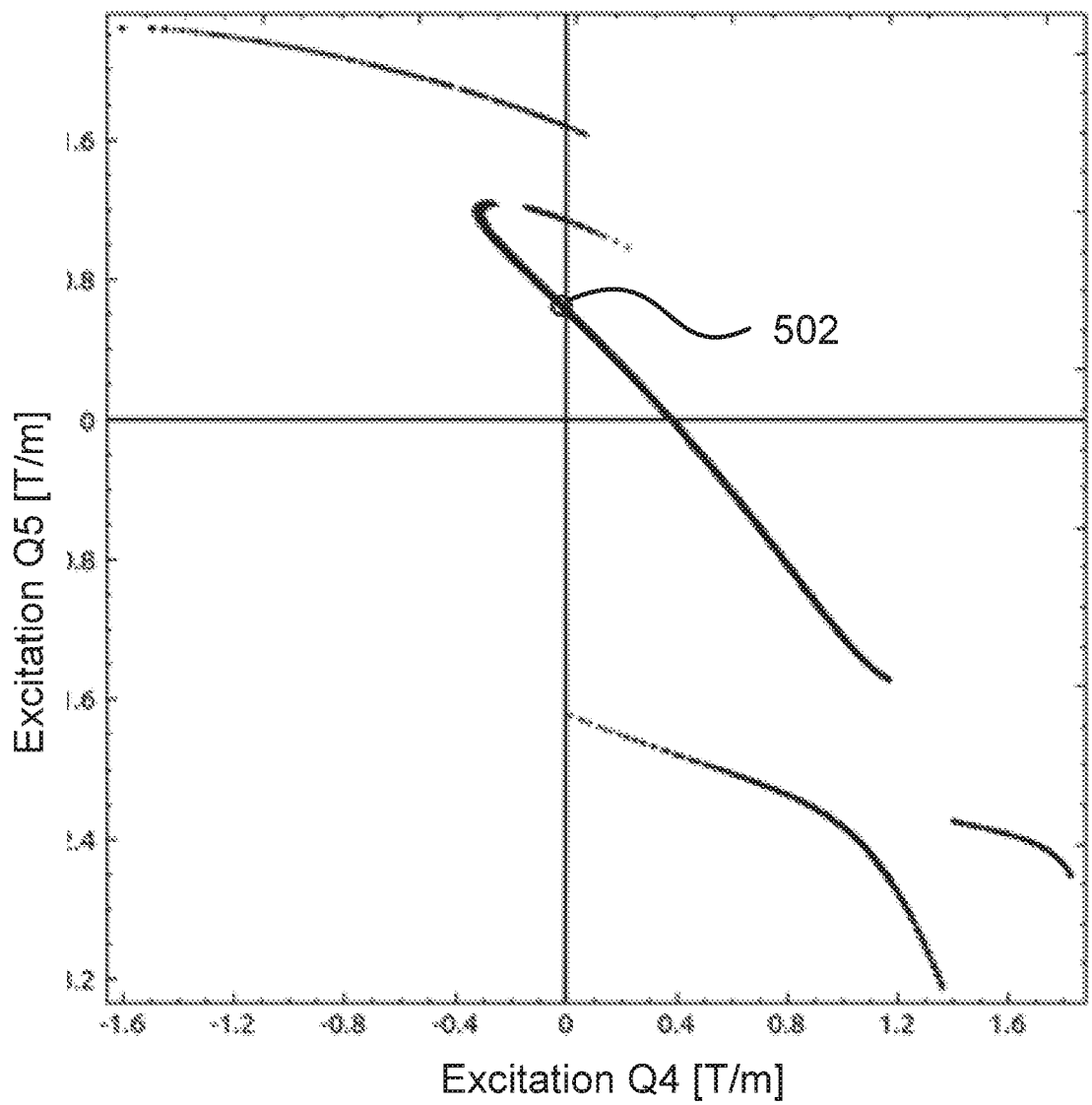
Fig 5a: EELS solutions, Q4 versus Q5

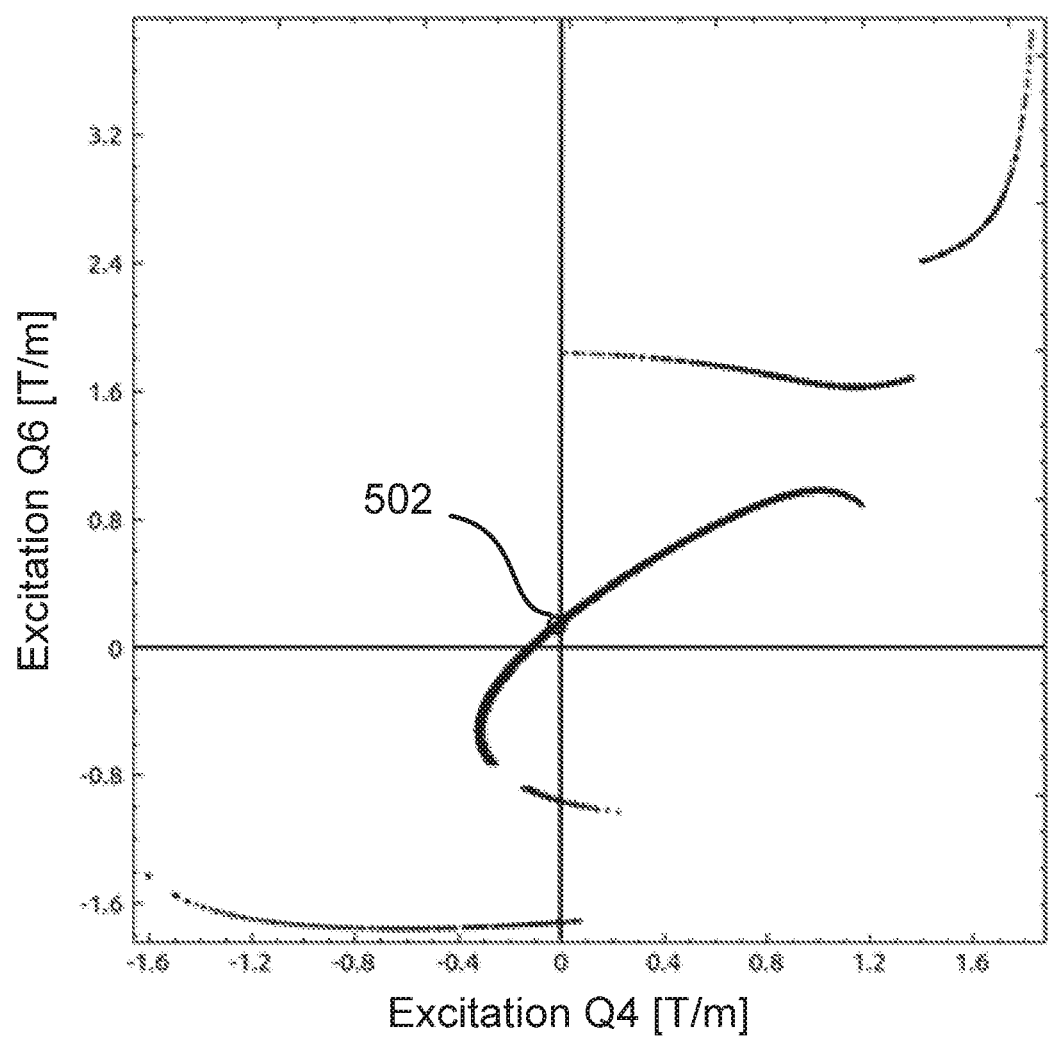
Fig 5b: EELS solutions, Q4 versus Q6

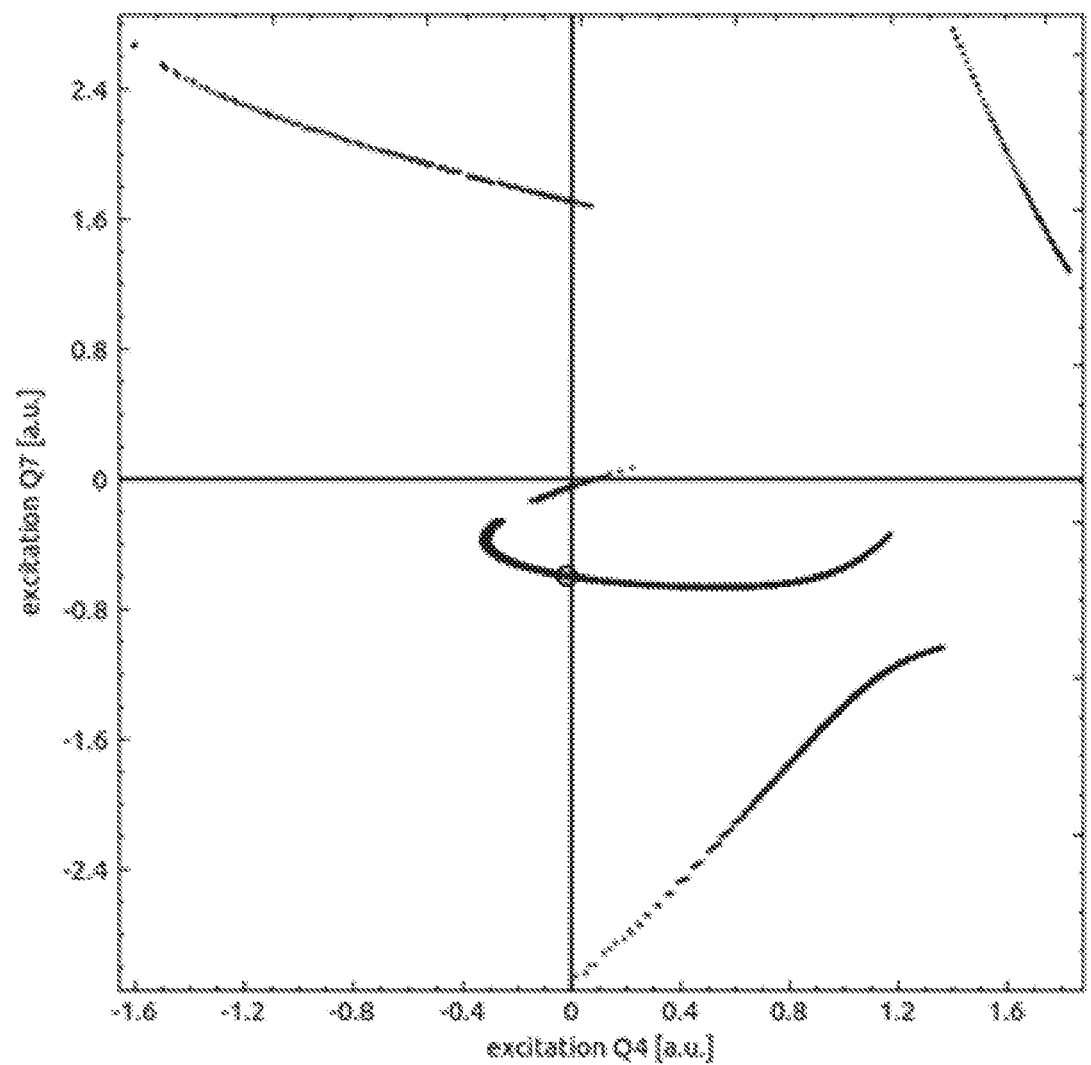
Fig 5c: EELS solutions, Q4 versus Q7

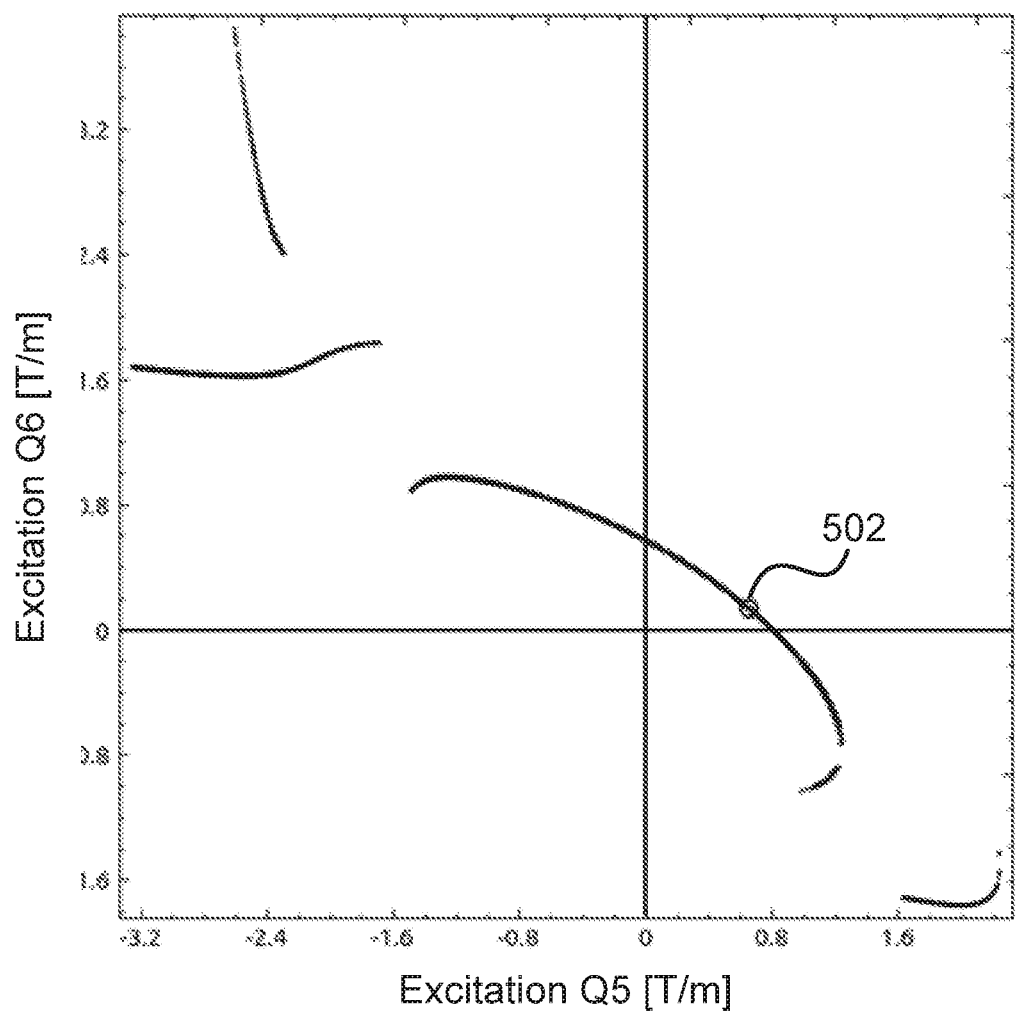
Fig 5d: EELS solutions, Q5 versus Q6

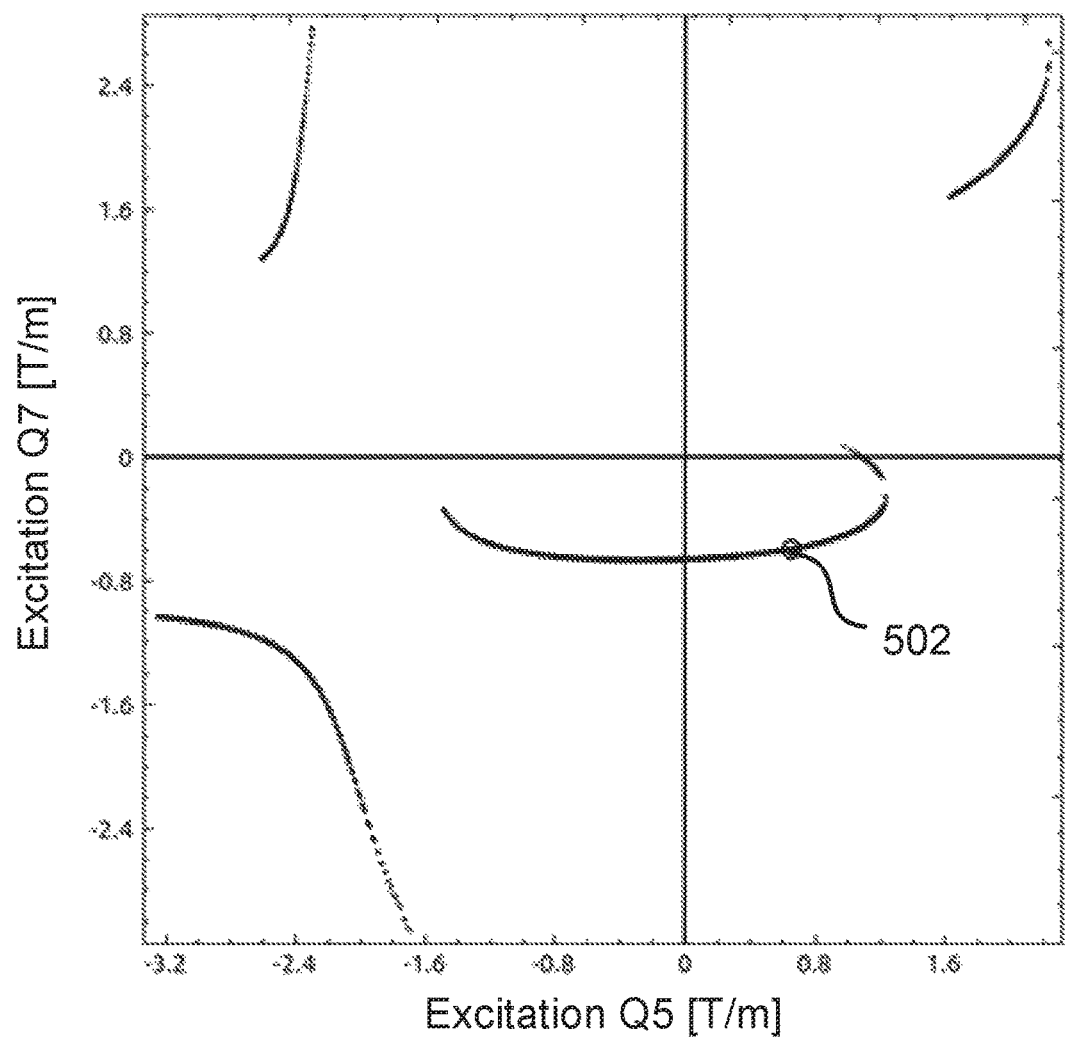
Fig 5e: EELS solutions, Q5 versus Q7

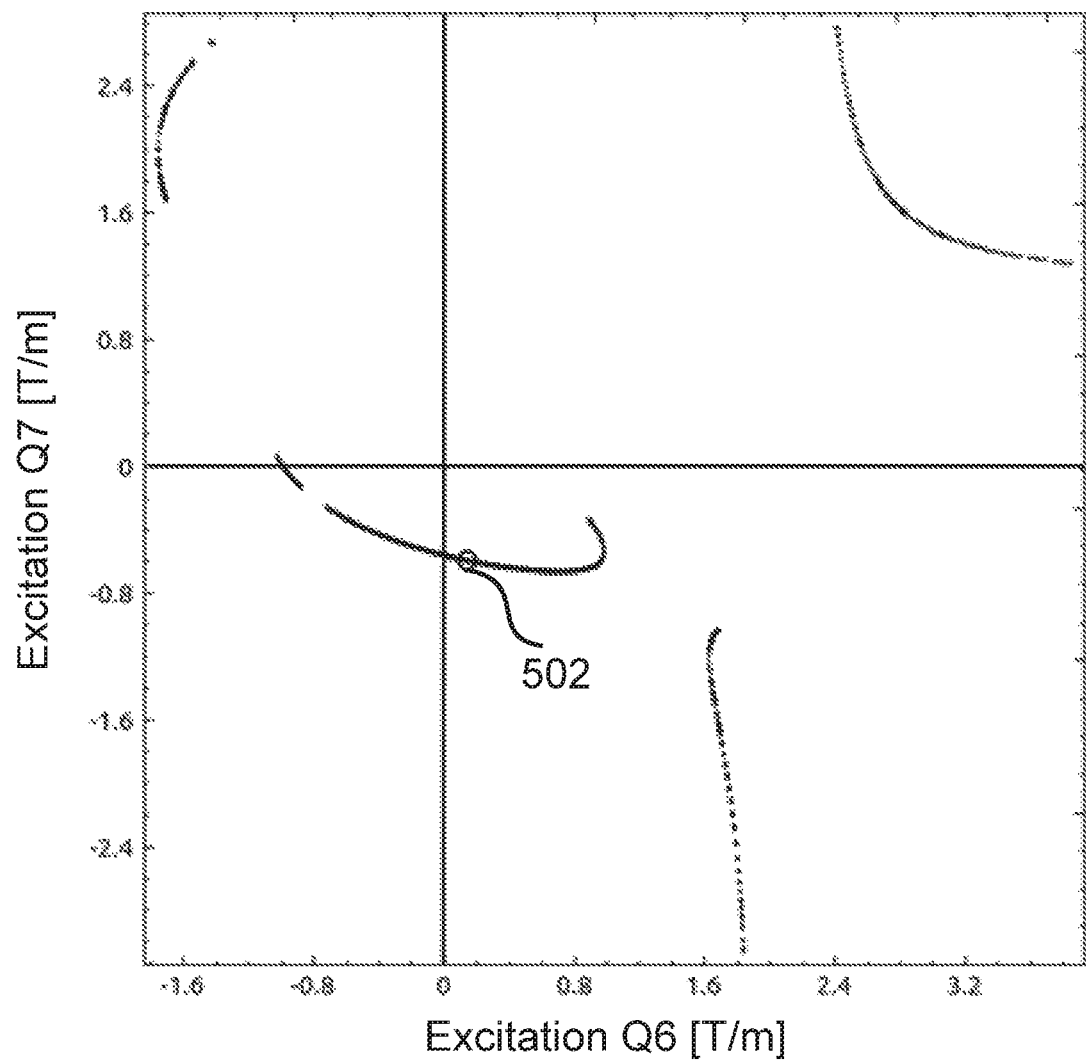
Fig 5f: EELS solutions, Q6 versus Q7

| Figure | Quadrupole excitation [T/m] | | | | | | Energy dispersion | Energy range | Spectrum distortion /linearity | Resolution (FWHM) | |
| --- | --- | --- | --- | --- | --- | --- | --- | --- | --- | --- | --- |
| | Q1 | Q2 | Q3 | Q4 | Q5 | Q6 | [eV/pixel] | [%] | [%] | eV | pixels |
| FIG. 4a | -0.04 | 0.025 | -2.53 | 2.12 | -2.74 | -3.22 | 0.3 | 0.2 | <0.7 | <0.3 | <1 |
| FIG. 4b | 0.04 | -0.025 | 2.53 | 2.33 | 1.21 | -0.08 | 1 | 0.6 | <2 | <1.7 | <1.7 |
| FIG. 4c | 0 | 0.016 | 0.37 | -0.03 | 0.66 | -0.60 | 3 | 2 | <1 | <3 | <1 |

Nominal energy 300 kV, excitation in tesla/meter, energy dispersion in eV/pixel for a 2048 pixel array of 30mm diameter, entrance aperture 4 mm diameter.

Table 1: performance of different PCF excitations

FIG. 7

POST COLUMN FILTER WITH ENHANCED ENERGY RANGE

The invention relates to a method of operating a Post Column Filter (PCF) for use in a (Scanning) Transmission Electron Microscope, the PCF equipped to operate in a first mode, the so-called EELS mode, in which an Electron Energy Loss Spectroscopy spectrum (EELS spectrum) is formed, said EELS spectrum showing an energy range, the PCF equipped to operate in a second mode, the so-called EFTEM mode, in which an Energy Filtered Transmission Electron Microscope image (EFTEM image) is formed, and the PCF comprising the following optical planes:
- an entrance plane,
- an image plane where in EELS mode the EELS spectrum is formed and in EFTEM mode the EFTEM image is formed,
- a slit plane between the entrance plane and the image plane where in EFTEM mode an energy dispersed focus is formed, the PCF comprising the following optical elements:
- an energy dispersive element between the entrance plane and the slit plane, the energy dispersive element dispersing an incoming beam of electrons in an energy dispersed beam,
- one or more pre-slit quadrupoles between the energy dispersive element and the slit plane,
- a multitude of post-slit quadrupoles between the slit plane and the image plane,
- a multitude of multipoles for correcting aberrations, and
- an energy selective slit that in EFTEM mode is inserted in the slit plane, the optical elements between the entrance plane and the slit plane in EFTEM mode forming an energy dispersed focus in the slit plane; and the one or more pre-slit quadrupole between the energy dispersive element and the slit plane in EFTEM mode enlarge the energy dispersion caused by the energy dispersive element.

A Transmission Electron Microscope (TEM), optionally equipped with a scanning unit thus turning it in a Scanning Transmission Electron Microscope (STEM), can be equipped with a PCF so as to add analysis methods to said TEM. A PCF is capable to operate in two modes.

One mode in which the PCF can operate is the EELS mode (Electron Energy Loss Spectroscopy mode), showing the intensity of electrons (the amount of electrons) that passed through a sample in the (S)TEM versus their energy loss. The EELS spectrum shows typically a large intensity of electrons that did not lose energy (the so-called zero-loss peak), and a continuum of low intensity showing electrons that lost energy, typically up to 10% of the zero-loss energy.

The other mode in which the PCF can operate is the Energy Filtered Transmission Electron Microscope (EFTEM) mode, in which a TEM image is formed using only those electrons that lost a predetermined energy (or lost no energy).

The use of such a PCF and the PCF itself is known to the person skilled in the art.

In the context of this invention a quadrupole is formed by the excitation of an optical element that is capable to form a quadrupole field. However, such an element may simultaneously form a dipole field, a hexapole field (also named a sextupole field), and higher order multipole fields (octupole fields, decapole fields, . . . ). Such an optical element may be purely magnetic, purely electrostatic, or a combination thereof.

The beam envelope at a position on the optical axis is the diameter of the beam at said position in a plane perpendicular to the optical axis. As quadrupoles are used, the beam envelope is often not a round beam envelope, but an ellipsoid.

Where 'focus' is used, this may refer to either a round focus or a line focus, and implies that the beam envelope in at least one direction is zero or close to zero.

Both a TEM and a STEM are referred to as a (S)TEM.

A method of operating such a PCF is known from Gubbens et al., "The GIF Quantum, a next generation post-column imaging energy filter", Ultramicroscopy 110 (2010), p. 962-970, further referred to as Gubbens.

Gubbens describes a new PCF, the GIF Quantum. According to its FIG. 1 the PCF comprises, centered round an optical axis, successively (as seen from the (S)TEM) an entrance plane (implicit), a first quadrupole D1, a dispersive element (a 90° prism bending the optical axis over 90 degrees), two pre-slit quadrupoles (D2 and D3), an energy selecting slit at the so-called slit plane, five post-slit quadrupoles (D4 to D8), a deflector and a pixelated detector in the form of a CCD camera in an image plane. The article further mentions the use of higher-order multipole fields (hexapole, octupole, etc.) to minimize aberrations and dipoles to keep the central beam on the optical axis.

It is noted that other PCFs of older design comprise less elements.

A beam of electrons produced by the (S)TEM travels along an optical axis. For the PCF the incoming beam can be described by an object plane (which has the enlarged image of either the sample to be imaged, or in some cases the diffraction plane) and a plane where the beam envelope forms a cross-over (where a focus is formed). The energy dispersive element, a 90° sector magnet, bends the beam over approximately 90°. Electrons with a higher energy than nominal are deflected over slightly less than 90°, electrons with an energy slightly less than the nominal energy are deflected over slightly more than 90°. A dispersed beam is thus formed. The quadrupoles between the entrance plane and the slit plane (together with the energy dispersive element) form a (line) focus on the slit plane of this energy dispersed beam. The function of the quadrupole closest to the slit plane is primarily to enhance the energy dispersion.

In EFTEM mode a slit is placed at the slit plane, preferably with an adjustable width. An (energy dispersed) image of the cross-over in the incoming beam is formed on the slit, and only electrons with a selected energy range are transmitted through the slit. The object is imaged (preferably achromatically, i.e., preferably without energy dispersion) on the image plane by the optical elements between the slit plane and the imaging plane. The performance in this mode is typically expressed as µm/eV at the slit plane, as well as the field-of-view at the entrance plane (diameter in e.g. µm).

In EELS mode the slit is retracted and the post-slit quadrupoles form an image of the dispersed focus on a pixelated detector (e.g., a CCD detector). On the detector thus a line is formed in which each point corresponds to a specific electron energy. The performance in this mode is typically expressed as eV/pixel. It is noted that smaller pixels result in a higher energy resolution, provided that aberrations have a size less than one pixel, and provided that the point spread function (or DQE or MTF) of the camera is not limiting.

For a given PCF configuration the aberrations put a limit to the relative energy resolution that can be obtained. Also, according to Gubbens, the size of the spectrum (in eV) that can pass cleanly through the optics to the CCD is limited (page 963, left column), which is another way of expressing that aberrations will limit the performance.

It is noted that an EELS spectrum often shows a large dynamic range in the detected intensity, with the so-called zero-loss peak showing several orders of magnitude higher intensity than other peaks. As known to the skilled artisan this can damage or at least blind the pixelated camera. To avoid this, the EELS spectrum (a line focus) can be spread over a large number of pixels by sweeping or defocusing the spectrum over the detector in a direction perpendicular to the dispersion direction, thereby reducing the intensity per pixel. It is also known to delete the zero-loss peak by imaging it outside the active area of the pixelated detector.

It is further noted that in EELS mode the energy selecting slit can be retracted or made sufficiently wide to transmit all electrons. Therefore the plane where the energy selecting slit may reside is further referred to as the slit plane.

It is mentioned that, although Gubbens generates the multipole fields by using dodecapoles, this is not a necessity and, for example, separate elements can be used.

It is also mentioned that, although a 90° magnetic sector magnet is often used, other angles can be used. Also an electrostatic dispersive element instead of a magnetic dispersive element may be used.

As can be observed from Gubbens, page 965, FIG. 2, the pre-slit quadrupole closest to the slit plane is used to enlarge the dispersion. The use of such energy dispersion enhancement is also mentioned by O. L. Krivanek et al., "Design and first applications of a post-column imaging filter", Microsc. Microanal. Microstruct., APRIL/JUNE 1992, p. 187, further referred to as Krivanek. At its page 190, item 4. Krivanek mentions that two quadrupoles magnify the spectrum (energy dispersed beam) by a factor of 6, although Krivanek is not specific which of the quadrupoles in item 4 causes the magnification.

To align the filter all quadrupoles, hexapoles, etc. should be excited such as to fulfill the imaging conditions and to minimize aberrations.

In EFTEM mode the optical elements between the entrance plane and the slit plane must be excited and aligned such, that a dispersed focus is formed at the slit plane.

It is noted that, if the slit is exactly perpendicular to the dispersion direction, and the slit is smooth within the diameter of the focus, astigmatism perpendicular to the dispersive direction is allowed.

To ease the alignment and to minimize the degrees of freedom for exciting all quadrupoles and higher order multipoles, the same excitation of the elements between entrance plane and slit plane as used for both EFTEM mode and EELS mode (although no slit is used in EELS mode). Alignment is done without a sample inserted, so that the beam is almost monochromatic and no or almost no dispersion occurs in the slit plane. A round spot is then formed on the slit or one of its knife edges, and the focusing condition is found by minimizing the diameter of said spot (judged by the rise/fall time when sweeping the spot over the slit or knife edge.

This method of aligning is described in U.S. Pat. No. 5,798,524 to Gatan.

A limitation of the prior art PCF is the limited energy range in EELS mode. As is explained in Gubbens there is a long-felt need to improve the performance of the PCF in EELS mode and enlarge the so-called "spectral field of view" (page 963, left column). This spectral field-of-view is also named the energy range. From Gubbens, page 963, table 1 it follows that since 1992 this energy range increased from 1024 eV @ 200 keV (0.5%) to 2048 eV@ 200 keV (1%) in 2009. This appears to be the result of adding extra quadrupole, hexapoles and octupoles to earlier designs. This boils down to a need to a PCF with smaller aberrations in EELS mode. Also the energy dispersive element is optimized for smaller aberrations (implicit from its paragraph 3.1.1). The energy dispersion in the slit plane is thus lowered to optimize the PCF.

It is noted that the energy range is a function of the energy of the electrons entering the PCF, and that the relative energy spread (the maximum energy range divided by the energy of the electrons entering the PCF) is approximately constant (apart from relativistic effects).

With existing state-of-the-art PCFs, an EELS spectrum with an energy range of at most about 1% of the energy of the electrons entering the entrance plane (the (S)TEMs high voltage) can thus be formed.

There is a need for a PCF with an enhanced energy range in EELS mode.

The invention intends to provide a solution to this problem.

To that end the invention is characterized in that in EELS mode the one or more pre-slit quadrupoles between the energy dispersive element and the slit plane do not enlarge the energy dispersion caused by the energy dispersive element.

Inventors came to the understanding that the enlarged energy dispersion at the slit plane is an asset in EFTEM mode, where only a small energy band is selected, but a drawback in EELS mode, especially when using a large energy range, as it results in a large beam envelope at the slit plane and at the optical elements (notably the post-slit quadrupoles) where the dispersion ray is bend back to the axis (typically the quadrupole following the slit plane). As known to the person skilled in the art of designing a PCF a large beam envelope results in large aberrations. Recognizing the problem, the solution might look simple: do not enhance the energy dispersion in EELS mode, but instead use the one or more pre-slit quadrupoles between the energy dispersive element and the slit plane to keep the energy dispersion identical or even de-magnify it (make the energy dispersion less).

However, for the skilled person (in the design of PCF's) this is counter-intuitive, as there is a long standing prejudice that it is not practical to use different settings for EFTEM-mode and EELS-mode as the degrees of freedom to adjust all quadrupoles and other multipoles to come to a proper imaging solution is too large: in prior art methods of using a PCF pre-slit quadrupoles are excited identical in both EFTEM and EELS mode. Also, this asks for new alignments when switching between modes, which might for an operator be time consuming and/or difficult, for example demanding change of the specimen, and might include the exchange of the sample, thereby losing positional accuracy etc.

The non-obviousness of introducing de-magnifying settings for EELS mode is also illustrated by the fact that Gubbens, confronted with the long-felt need to enlarge the energy range in EELS, designed a PCF without such de-magnifying settings for EELS mode but instead with a prism of reduced size (Gubbens, page 964, section 3.1.1). As is known to the skilled artisan, a smaller prism does allow for a larger energy range due to its smaller dispersion, but it has the drawback of increased higher-order aberrations due to the increased relative size of the beam envelope inside the prism.

Inventors found, by clever modelling and computer simulations, as well as the use of a sophisticated computer, a set of solutions that can be used to find the excitation for quadrupoles and higher order multipoles for a PCF where the energy dispersion is not magnified.

Only slight optimization (well within the capabilities of the skilled person) is needed for fine tuning.

Inventors hereby showed that it is possible to use one set of quadrupole excitations for EFTEM mode, the energy dispersion is magnified (enlarged), and to use another set of quadrupole excitations for EELS mode, where the energy dispersion is de-magnified (not enlarged).

It is noted that this implies that many, if not all, quadrupoles have excitations that differs for the two modes.

It is further noted that it is possible that several sets of excitations can be found/used (several solutions) corresponding to several EELS modes, the EELS modes differing in energy range. In other words: the set of excitations for a 2% energy range may differ for the set of excitations for a 0.5% energy range. Both sets are of use to the user of the (S)TEM, as the lower range offers a 'zoom-in' of part of the larger setting, offering for example improved resolution.

In an embodiment no energy dispersed focus at the slit plane is formed in EELS mode.

In EELS mode there is no need to form an energy dispersed focus at the slit plane, as the energy selecting slit is not used. By eliminating this requirement when determining the excitation of the quadrupoles, inventors found a suite of solutions with reduced aberrations (thus: improved performance) for the PCF.

In another embodiment a pixelated detector is placed at the image plane.

Preferably a pixelated detector is used, such as a CCD camera or a CMOS camera.

In yet another embodiment the number of post-slit quadrupoles is at least four.

When a PCF is used solely for EELS, only two post-slit quadrupoles can suffice. For an improved performance in EELS mode, and in EFTEM mode, a minimum of four quadrupoles is recommended for sufficient flexibility. It is noted that the number of higher order multipoles to correct aberrations may even be higher.

In yet another embodiment the dispersive element is a 90° magnetic prism.

A PCF is used in conjunction with a (S)TEM, typically operating with a maximum beam energy of 100 keV to 300 keV or more. This makes electrostatic designs less practical. Although other angles than 90° can be used, the advantage of a 90° magnetic prism lay in the simple mechanical lay-out in the (S)TEM, without adding extra height to the (S)TEM.

In yet another embodiment the number of pre-slit quadrupoles is at least two.

The 90° magnetic prism can be made double-focusing, that is: focusing in both the energy dispersive and the non-energy dispersive direction by tilting the faces of the magnetic prism (wedge shapes) or by tilting the entrance and exit plane of the prism These tilted faces or tilted entrance planes introduce quadrupole action which, when properly dimensioned, gives a double focus at the dispersive plane.

The addition of two quadrupoles, one at each side of the prism, can enable the use of a non-double-focusing magnet, or can be used to correct small residual quadrupole actions of the prism, or compensate for slight deviations from the ideal situation. Preferably the number of pre-slit quadrupole is then one pre-slit quadrupole between entrance plane and energy dispersive element, and two between the energy dispersive element and the slit-plane. The latter two can, in some instances, be combined.

In yet another embodiment at the position of the quadrupole closest to the image plane or between the quadrupole closest to the image plane and the image plane a deflector is positioned for deflecting the EELS spectrum over the image plane in the non-dispersive direction.

A deflector at this position can be used to image different parts of the EELS spectrum at different parts of the detector placed in the image plane. To this end, the nominal energy selected by the prism must be changed between the exposures of the different parts of the detector. This can be used to reduce the overhead time of reading out the pixelated detector. A complete spectrum can then be made by one read-out of the camera and stitching several parts of the image together.

It is noted that although an electrostatic deflector is not practical as an energy dispersive element (due to the high voltages needed), it is known to have an electrically isolated tube in the 90° magnetic prism, through which the electrons travel. By varying the potential of that tube, the nominal energy of the electrons travelling through the tube is slightly modified, and this thus offers a fast way to change the beam energy for which the 90° magnetic prism bends over 90°. Together with a deflector following the post slit quadrupoles, this enables so-called dual-eels.

In yet another embodiment in EELS mode the post-slit quadrupoles are divided in a first group of adjacent quadrupoles and a second group of adjacent quadrupoles, each quadrupole of the first group acting as a positive lens in the plane where energy dispersion occurs and each quadrupole of the second group acting as a negative lens in the plane where energy dispersion occurs.

Inventors found that many of the preferred solutions (showing little aberrations) occur in a mode where two groups of quadrupoles act together, one group together acting as one quadrupole, the position and strength of which can be adjusted by the relative excitations of the first group, and a second group together acting as another quadrupole, the position and strength of which can be adjusted by the relative excitations of the second group.

In yet another embodiment in EELS mode two of the post-slit quadrupoles are each excited with an excitation at least three times higher than any of the other post-slit quadrupoles.

Inventors found that another group of preferred solutions (showing little aberrations), partly overlapping with the embodiment described in the above two paragraphs, occur when two post-slit quadrupoles cause most of the quadrupole action. Inventors found that in most cases a quadrupole excitation less than three time that of another quadrupole causes negligible contribution to aberrations of said less excited quadrupole.

In an aspect of the invention a Post Column Filter (PCF) for use in a (Scanning) Transmission Electron Microscope, the PCF equipped to operate in a first mode, the so-called EELS mode, in which an Electron Energy Loss Spectrum (EELS spectrum) is formed, the so-called EFTEM mode in which an Energy Filtered Transmission Electron Microscope image (EFTEM image) is formed, the PCF showing an optical axis, and the PCF comprising the following optical planes:
  an entrance plane,
  an image plane where in EELS mode an EELS spectrum is formed and in EFTEM mode an EFTEM image is formed,
  a slit plane between the entrance plane and the image plane where in EFTEM mode an energy dispersed focus is formed,
the PCF comprising the following optical elements:
  an energy dispersive element between the entrance plane and the slit plane dispersing an incoming beam of electrons in an energy dispersed beam,
  one or more pre-slit quadrupoles between the energy dispersive element and the slit plane, a multitude of post-slit quadrupoles between the slit plane and the image plane,
a multitude of multipoles for correcting aberrations, and
an energy selective slit that in EFTEM mode is inserted in the slit plane
the PCF further comprising:
power supplies to excite said optical elements, and
a programmable controller for controlling the power supplies,
the controller programmed to control the power supplies in EFTEM mode such that the one or more pre-slit quadrupoles enlarge the energy dispersion caused by the energy dispersive element,
is characterized in that
the programmable controller is programmed to control the power supplies in EELS mode such that the one or more pre-slit quadrupoles between the energy dispersive element and the slit plane do not enlarge the energy dispersion caused by the energy dispersive element.

As later explained the excitation of the optical elements is pre-determined by a dedicated computer. This computer need not be part of the PCF. The programmable controller can determine the excitations needed by using for example a look-up table that is loaded with values during the manufacturing of the PCF, based on the results of the pre-determined values. It is noted that also variables such as the nominal energy (the energy of the electron beam in the microscope at a given moment) is input for determining the excitations. When the quadrupoles are electrostatic, the excitation (in volts) scales linearly with the nominal energy of the electrons (apart from relativistic effects). When the quadrupoles are magnetic, the excitation (in Amperes) scales with the square root of the nominal energy of the electrons (apart from relativistic effects).

In an embodiment of the PCF the programmable controller is programmed such that in EELS mode no energy dispersed focus is formed on the slit plane.

Inventors found that by using this extra degree of freedom resulted in solutions showing a better performance of the PCF.

In another embodiment, the post-slit quadrupoles can be divided in a first group of adjacent quadrupoles and a second group of adjacent quadrupoles, and the programmable controller is programmed such that the first group acts as a positive lens in the plane where energy dispersion occurs and the second group acts as a negative lens in the plane where energy dispersion occurs.

In yet another embodiment of the PCF the programmable controller is further programmed such that in EELS mode two of the post-slit quadrupoles are excited with an excitation at least three times higher than any of the other post-slit quadrupoles.

In yet another embodiment of the PCF the programmable controller is in EELS mode programmed to excite the post-slit quadrupoles such that the maximum beam envelope in the direction where energy dispersion occurs is substantially minimized at the post-slit quadrupoles.

As known to the skilled person a large beam envelope in a quadrupole results in corresponding large aberrations. Therefore the excitation of the quadrupoles should be such that the beam envelope in the direction where energy dispersion occurs is (roughly) minimized.
As aberrations perpendicular to the direction where energy dispersion occurs (the dispersion direction) result in a smearing of the line focus in a direction perpendicular to the dispersion direction without reducing resolution in the dispersion direction, these aberrations are not critical, and might even be beneficial as they result in exposure of more pixels without the loss of energy resolution, the larger number of pixels resulting in a smaller chance of overexposure.

The invention will now be elucidated using figures, in which identical reference signs indicate corresponding features. To that end:

FIG. 1 schematically shows an EELS spectrum,
FIG. 2 schematically shows a PCF,
FIG. 3 schematically shows a ray diagram in EFTEM mode,
FIG. 4a-4c schematically show ray diagrams in EELS mode,
FIG. 5a-5f schematically show solutions for the post-slit quadrupoles,
FIG. 6 schematically show a flow chart for obtaining the solutions; and
Table 1 of FIG. 7 shows excitation performance data for the PCF configurations corresponding to FIGS. 4a-4c.

FIG. 1 schematically shows an EELS spectrum.
FIG. 1 shows an EELS spectrum showing the part where so-called core-losses occur. A core-loss is the result of an irradiating electron hitting an atom of the sample in such a way that an electron of the atom is knocked out of its shell. This vacancy is then refilled by another electron of the sample, as a result of which an X-ray photon is emitted. The irradiating electron lost energy, but proceeds in largely the same direction, to be imaged in the entrance plane of the PCF.

FIG. 1 is a plot with along the horizontal axis the energy loss (in eV) of the electrons entering the PCF (and thus after passing through the sample) and along the vertical axis the number of electrons (in arbitrary units). As the number of electrons is strongly dependent on the energy loss, the vertical scale is a logarithmic scale. As seen the number of electrons shows a jump at 1.965 keV, corresponding to the Sr L3-peak, and another peak at 2.00 keV, corresponding to the Sr L2 peak. At 5 keV another jump (another peak) can be observed, corresponding to the Ti K-peak.

Data for the electron binding energy are derived from L. C. Feldman et al., "Fundamentals of surface and thin film analysis", Elsevier Science Publishing Co., Inc, 1986, ISBN 0-444-00989-2, appendix 5.

It is noted that these energies are slightly different from the energies often found for X-ray energies, as they do not represent the energy difference from one energy level in the atom to the other, but the energy needed to eject an electron from the atom, often so energetic that the electron is ejected with a surplus energy that is then converted to heat. See also section 10.2 (page 234) of said publication.

FIG. 1 shows that a large "overview" of an EELS spectrum, spanning a large energy width, is very useful to identify the peaks present in the EELS spectrum. It is noted that after this a more detailed picture can be made with a larger energy resolution and a smaller energy width can be made, showing more peaks and thus enabling further proof of the elements found.

FIG. 2 schematically shows a PCF.
FIG. 2 schematically shows a PCF 200 with an optical axis 202 around which optical elements are arranged and along which a beam of incoming electrons travel, an entrance plane 204, an image plane 206, and a slit plane S between the entrance plane and the image plane, an energy dispersive element in the form of a 90° magnetic prism M between the entrance plane and the slit plane, a first quadrupole Q1 between the entrance plane and the energy dispersive element, two pre-slit quadrupoles Q2 and Q3 between the energy dispersive element and the slit plane, Q2 arranged closest to the energy dispersive element and Q3 arranged closest to the slit plane, four post-slit quadrupoles Q4, Q5, Q6 and Q7 between the slit plane and the image plane, in which a higher number indicates a larger distance from the slit plane, and between Q7 (the quadrupole closest to the image plane) and the image plane a deflector D. In the slit plane a slit can be positioned (but need not be present).

It is noted that the optical axis 202, depicted as a straight line, in reality is a curved axis, the curvature introduced by the energy dispersive element (the magnetic prism).

It is further noted that the magnetic prism may comprise multipoles by shaping the entrance and exit surfaces of the magnet or by tilting the internal faces of the magnet. In this way the magnetic prism can be made, for example, double focusing.

It is also noted that in a PCF dipoles, hexapoles, octupoles etc. are also included to align the beam of electrons travelling through the PCF and minimize the aberrations. This is known to the skilled person and does not affect the invention, and for the sake of clarity these optical elements are not shown.

The 90° magnetic prism deflects electrons with nominal energy over 90°, and electrons with a lower energy over more than 90°. Hereby an energy dispersed beam is formed, enabling the PCF to act as an EFTEM detector or an EELS detector. The energy dispersion occurs in only one plane, the plane perpendicular thereto is essentially free from energy dispersion.

FIG. 3 schematically shows a ray diagram in EFTEM mode.

FIG. 3 shows the planes and optical elements of FIG. 1, with three principal rays:

Ray 302 depicts the dispersion ray (the ray in the plane where dispersion occurs) for electrons that lost energy, Ray 304 depicts a ray with electrons having nominal energy coming from the center of the cross-over in front of the PCF, double focused at the slit in the dispersive plane, that is: in the plane where dispersion occurs.

Ray 306 depicts a ray with electrons having nominal energy coming from the center of the cross-over in front of the PCF, double focused at the slit perpendicular to the energy dispersive plane, that is: in the plane where no energy dispersion occurs.

In EFTEM mode the optical elements between the entrance plane and the slit plane (Q1, M, Q2 and Q3) form an energy dispersed focus at the slit plane.

It is noted that when the TEM is in imaging mode (imaging the sample) the energy dispersed focus is an image of the diffraction pattern. When the TEM is in diffraction mode the energy dispersed focus is an image of the sample.

In the energy dispersed focus both rays 304 and 306 cross the optical axis. This indicates that for the whole area of the sample imaged on the image plane all electrons with a predetermined energy loss focus at the same (energy dispersed) position. Electrons that lost energy are focused on the dispersed focus, but not on the optical axis. By placing a slit in the slit plane only electrons with a predetermined energy loss are transmitted through the slit and an (achromatic) image of the specimen (or in some cases the diffraction plane of the microscope, comprising the Fourier transform of the sample) is formed on the imaging plane 206 by the post slit quadrupoles. The image only comprising those electrons that lost a predetermined energy (this can be no energy loss, i.e. only elastically scattered electrons, or electrons showing an energy loss corresponding to a predetermined core loss, for example corresponding to the Sr L3-peak). In this way it is possible to picture the presence of an element in the imaged part of the sample. By using different positions of the slit (and thus passing different energies through the slit), different images can be acquired, each for example showing where the sample comprises certain elements. By adding several such images and using 'false colors', the distribution of elements in a sample can be determined on an (electron) microscopic scale.

It is noted that the pre-slit quadrupole closest to the slit plane, Q3, is in this mode a negative lens in the direction where energy dispersion occurs, thus enlarging the energy dispersion and enhancing the effect of the magnetic prism.

In EELS mode an energy dispersed image of a cross-over of the microscope is formed on the image plane. All electrons are passed through the slit plane, either by opening the slit wide or by retracting the slit altogether. A line is formed on a pixelated detector in the image plane, in which each position on the line corresponds with a specific energy loss. As no energy selection is made by the slit, no focus needs to be formed at the slit plane.

FIG. 4a schematically shows a prior art ray diagram.

In FIG. 4a the excitations of the optical elements Q1, M, Q2 and Q3 are identical to the excitations in EFTEM mode. An advantage thereof is that no changes need to be made in the optical elements between entrance plane and slit plane when switching between EELS and EFTEM mode, and that only one alignment of these elements is sufficient for both EFTEM and EELS mode. However, it can be seen that ray 302 deviates rather far from the axis at Q4, and as a result thereof (as known to the skilled artisan) relative large aberrations are introduced by Q4. The performance is shown in table 1 of FIG. 7, in the row labeled 'FIG. 4a'.

It is noted that the horizontal axis (the axis parallel to the optical axis) is indicative for the relative dimensions of a PCF which performances and preferred excitations are discussed later in this text. However, the invention is valid for other relative and/or absolute dimensions.

Ray 302, showing the ray where energy loss occurs, is imaged at a different position than where rays 304 and 306 (both rays with nominal energy) are imaged.

It is remarked that it is common practice to image ray 306 (the ray with nominal energy in the plane where no dispersion occurs) on the detector as a line focus perpendicular to the direction where dispersion occurs. Hereby the EELS spectrum forms a band instead of in a line to avoid overillumination of a (pixelated) detector, for example a CCD camera or a CMOS camera in the image plane. The total intensity can be derived by the addition of the intensity on the pixels perpendicular to the dispersion direction.

FIG. 4b schematically shows a ray diagram according to the invention.

Here the excitations of quadrupoles Q1, Q2 and Q3 are all inverted (except what is needed to counter possible quadrupole effects caused by the 90° magnet), which basically rotates their optical action over 90°. As a result the deviation from the optical axis of the dispersed beam 302 is much less, especially as Q3 does not deflect the dispersed beam 302 away from the optical axis.

The performance is shown in table 1 of FIG. 7, in the row labeled 'FIG. 4b.'

FIG. 4c schematically shows an alternative ray diagram according to the invention. As the slit is not used to filter part of the electrons, no focus need be formed on the slit plane. This gives more degrees of freedom to determine optimal excitations for the quadrupoles. For this particular set of excitations (the excitations shown in FIG. 5, reference sign 502), the performance is shown in table 1 of FIG. 7, in the row labeled 'FIG. 4c.'

FIGS. 5a-5f show the excitations corresponding to the ray diagram of FIG. 4c.

As mentioned before, the inventors used a computer program to find solutions that result in EELS imaging conditions. To reduce the number of variables, only excitations of the post-slit quadrupoles are calculated, and the excitations of the pre-slit quadrupoles is determined by hand. The skilled person is able to generate a set of reasonable 'educated guesses' for the pre-slit quadrupoles. The method used for determining the excitations of the post-slit quadrupoles is schematically given in a following paragraph.

The computer now generates a number of solutions where an EELS imaging condition occurs. These are solutions in a four-dimensional space, as it are solutions for four quadrupoles. When representing this in two-dimensional figures, these are represented by six graphs:
Q4 versus Q5 (FIG. 5a),
Q4 versus Q6 (FIG. 5b),
Q4 versus Q7 (FIG. 5c),
Q5 versus Q6 (FIG. 5d),
Q5 versus Q7 (FIG. 5e), and
Q6 versus Q7 (FIG. 5f).
In each of these figures a number of dots are shown, each dot corresponding to a particular solution. One solution is shown in all figures as dot 502. This particular solution gives the ray diagram of FIG. 4c.

It is noted that the excitations in these figures and in table 1 are in Tesla/meter for a nominal beam energy of 300 keV. The skilled artisan knows how to translate these excitations to the currents for the individual quadrupole coils, taking into account the radiuses of these quadrupoles, their lengths, the number of windings on their coils, and the nominal energy of the beam at hand. As can be seen the excitation of Q4 is almost zero, as is the excitations of Q6. Most of the action is achieved by Q5 and Q7, where Q5 acts as a positive lens in the dispersive plane and Q7 as a negative in that plane.

Having these sets of solutions, the same computer can now using for example ray tracing software, determine the aberrations for each (or at least a part) of the solutions.

It is noted that, based on his knowledge, the skilled artisan can limit the number of solutions, for example excluding a too large excitation of any of the quadrupoles.

Inventors found that good solutions (that is: solutions with low aberrations compared to other solutions) often occur when two post-slit quadrupoles show most of the action, as this implies that the other quadrupoles introduce little aberrations. Other good solutions occur when quadrupoles work together to act as one quadrupole, the quadrupoles adjacent to each other. In general the rays should be as smooth as possible.

It is noted that here the computer solves the solutions for four quadrupoles. One might wonder why not solve the problem with more quadrupoles, preferably all quadrupoles. The answer is that, at this moment, finding the imaging conditions is rather taxing on the computer due to the large number of points in the four dimensional space that must be calculated. When adding three quadrupoles, this is equivalent to finding solutions in a seven dimensional space.

FIG. 6 schematically shows a flow-chart for determining the excitations of the post-slit quadrupoles:
A step 602 where in a four dimensional space (k,l,m,n) nodes (for example −1000 . . . +1000 for each variable) are determined, each node representing a set of excitations for Q4 (the k parameter), Q5 (the l parameter), Q6 (the m parameter) and Q7 (the n parameter);

A step 604 in which the amount of nodes that must be evaluate/simulated is reduced by marking nodes that will never (or most likely evaluate as a solution, or not as a best solution. Examples of nodes that can be skipped: the nodes where all quadrupoles have the same sign, or the nodes where all quadrupoles show a large excitation (in other words: only nodes within a 4-dimensional sphere need be used, not within a tesseract).

A step 606 in which a set of input parameters is provided (ray 302, 304 and 306 at the slit plane):

A step 608 in which for the nodes left over after step 604 it is evaluated/simulated if they represent a solution, i.e. whether the imaging solutions are (sufficiently) met, A step 610 in which for the nodes that represent a solution a performance value is determined, for example using ray-tracing software (commercially available), A step 612 in which the best solution is determined An optional step 614 of providing other input parameters and re-iterating the process.

A step 616 of providing the best solution.

It is noted that for different relative energy ranges, different solutions are used. For example, an EELS spectrum for a range of 1 keV at a nominal energy of 100 keV can use a different solution than an EELs spectrum for a range of 2 keV at a nominal energy of 100 keV.

It is further noted that efficient programming, and a fast computer, then lead to results that compare favorable to the results obtained for traditional PCF usage.

Table 1 shows the performance for different settings of a PCF. For these figures of merit the PCF operates at a nominal beam energy of 300 keV (so: a zero-loss peak at 300 keV), the PCF uses a 2048 pixel array detector of 30 mm diameter, the entrance aperture of the filter has a diameter of 4 mm.

In the row FIG. 4a, FIG. 4b and FIG. 4c it shows the settings and performance corresponding to FIG. 4a, FIG. 4b and FIG. 4c respectively.

In columns Q1 . . . Q7 the excitations of the different quadrupoles are given in tesla/meter. In the column 'energy dispersion' the energy dispersion at the camera is given in [eV/pixel]. In the column 'energy range' the energy range captured by the pixel array detector is given as fraction of the beam energy.

In the column Spectrum distortion/linearity the non-linearity of the EELS spectrum caused by third and higher order aberrations of the quadrupoles is given in % of the energy range.

In the column resolution the blur of the energy resolution caused by third and higher order aberrations of the quadrupoles is given at (full width @ half maximum) in eV and in pixels. Note that blur smaller than 1 pixel is below the detection limit.

It is noted that the prior art PCF disclosed by Gubbens (Quantum GIF) has a better performance than what is shown in table 1, row FIG. 1. This is due to, among others, optimization of the dimension of the sector magnet, etc.

CITED NON-PATENT LITERATURE

-1- A. Gubbens et al., "The GIF Quantum, a next generation post-column imaging energy filter", Ultramicroscopy 110 (2010), p. 962-970.

-2- O. L. Krivanek et al., "Design and first applications of a post-column imaging filter", Microsc. Microanal. Microstruct., APRIL/JUNE 1992, p. 187.
-3- L. C. Feldman et al., "Fundamentals of surface and thin film analysis", Elsevier Science Publishing Co., Inc, 1986, ISBN 0-444-00989-2, appendix 5.

The invention claimed is:

1. A method of operating a Post Column Filter (PCF) in a Scanning/Transmission Electron Microscope, the PCF equipped to operate in a first mode, the so-called EELS mode, in which an Electron Energy Loss Spectroscopy spectrum (EELS spectrum) is formed, said EELS spectrum showing an energy range, the PCF equipped to operate in a second mode, the so-called EFTEM mode, in which an Energy Filtered Transmission Electron Microscope image (EFTEM image) is formed, and the PCF comprising the following optical planes:
   an entrance plane,
   an image plane where in EELS mode the EELS spectrum is formed and in EFTEM mode the EFTEM image is formed, and
   a slit plane between the entrance plane and the image plane where in EFTEM mode an energy dispersed focus is formed,
   the PCF comprising the following optical elements arranged round an optical axis:
   an energy dispersive element between the entrance plane and the slit plane, the energy dispersive element dispersing an incoming beam of electrons in an energy dispersed beam,
   one or more pre-slit quadrupoles between the energy dispersive element and the slit plane,
   a multitude of post-slit quadrupoles between the slit plane and the image plane,
   a multitude of multipoles for correcting aberrations, and
   an energy selective slit that in EFTEM mode is inserted in the slit plane,
   in EFTEM mode, the optical elements between the entrance plane and the slit plane forming an energy dispersed focus in the slit plane; and the one or more pre-slit quadrupoles between the energy dispersive element and the slit plane enlarge the energy dispersion caused by the energy dispersive element; and
   in EELS mode, the one or more pre-slit quadrupoles between the energy dispersive element and the slit plane do not enlarge the energy dispersion caused by the energy dispersive element.

2. The method of claim 1 in which, in EELS mode, no energy dispersed focus is formed at the slit plane.

3. The method of claim 1 in which a pixelated camera is placed at the image plane.

4. The method of claim 1 in which the number of post-slit quadrupoles between the slit plane and the image plane is at least four.

5. The method of claim 1 in which the energy dispersive element is a 90° magnetic prism.

6. The method of claim 1 in which at least one quadrupole is placed between the entrance plane and the dispersive element.

7. The method of claim 1 in which at the position of the quadrupole closest to the image plane or between the quadrupole closest to the image plane and the image plane a deflector is positioned for deflecting the EELS spectrum over the image plane.

8. The method of claim 1 in which, in EELS mode, the post-slit quadrupoles are divided in a first group of adjacent quadrupoles and a second group of adjacent quadrupoles, each quadrupole of the first group acting as a positive lens in the plane where energy dispersion occurs and each quadrupole of the second group acting as a negative lens in the plane where energy dispersion occurs.

9. The method of claim 1 in which, in EELS mode, two of the post-slit quadrupoles are each excited with an excitation at least three times higher than any of the other post-slit quadrupoles.

10. The method of claim 2 in which a pixelated camera is placed at the image plane.

11. The method of claim 2 in which in which the number of post-slit quadrupoles between the slit plane and the image plane is at least four.

12. The method of claim 2 in which at least one quadrupole is placed between the entrance plane and the dispersive element.

13. The method of claim 3 in which at least one quadrupole is placed between the entrance plane and the dispersive element.

14. The method of claim 4 in which at least one quadrupole is placed between the entrance plane and the dispersive element.

15. The method of claim 2 in which, in EELS mode, the post-slit quadrupoles are divided in a first group of adjacent quadrupoles and a second group of adjacent quadrupoles, each quadrupole of the first group acting as a positive lens in the plane where energy dispersion occurs and each quadrupole of the second group acting as a negative lens in the plane where energy dispersion occurs.

16. A Post Column Filter (PCF) for use in a Scanning/Transmission Electron Microscope, the PCF equipped to operate in a first mode, the so-called EELS mode, in which an Electron Energy Loss Spectrum (EELS spectrum) is formed, the PCF equipped to operate in a second mode, the so-called EFTEM mode in which an Energy Filtered Transmission Electron Microscope image (EFTEM image) is formed, the PCF showing an optical axis, and the PCF comprising the following optical planes:
   an entrance plane,
   an image plane where in EELS mode an EELS spectrum is formed and in EFTEM mode an EFTEM image is formed,
   a slit plane between the entrance plane and the image plane where in EFTEM mode an energy dispersed focus is formed,
   the PCF comprising the following optical elements arranged around an optical axis:
   an energy dispersive element between the entrance plane and the slit plane dispersing an incoming beam of electrons in an energy dispersed beam,
   one or more pre-slit quadrupoles between the energy dispersive element and the slit plane,
   a multitude of post-slit quadrupoles between the slit plane and the image plane,
   a multitude of multipoles for correcting aberrations, and
   an energy selective slit that in EFTEM mode is inserted in the slit plane,
   the PCF further comprising:
   power supplies to excite the optical elements and
   a programmable controller for controlling the power supplies,
   the controller programmed to control the power supplies in EFTEM mode such that the one or more quadrupoles between the energy dispersive element and the slit plane enlarge the energy dispersion caused by the energy dispersive element, wherein the programmable controller is programmed to control the power supplies in EELS mode such that the one or more quadrupoles between the energy dispersive element and the slit plane do not enlarge the energy dispersion caused by the energy dispersive element.

17. The PCF of claim 16 in which the programmable controller is further programmed such that, in EELS mode, no energy dispersed focus is formed on the slit plane.

18. The PCF of claim 16 in which the post-slit quadrupole scan be divided in a first group of adjacent quadrupoles and a second group of adjacent quadrupoles, and the programmable controller is programmed such that the first group acts as a positive lens in the plane where energy dispersion occurs and the second group acts as a negative lens in the plane where energy dispersion occurs.

19. The PCF of claim 16 in which the programmable controller is further programmed such that, in EELS mode, two of the post-slit quadrupoles are excited with an excitation at least three times higher than any of the other post-slit quadrupoles.

20. The PCF of claim 16 in which the programmable controller is programmed such that, in EELS mode, the programmable controller excites the post-slit quadrupoles such that the maximum beam envelope at the quadrupoles in the direction where energy dispersion occurs is substantially minimized.

* * * * *